United States Patent [19]

Nishino et al.

[11] Patent Number: 4,513,177
[45] Date of Patent: Apr. 23, 1985

[54] LOUDSPEAKING TELEPHONE SYSTEM

[75] Inventors: Masakazu Nishino, Yokohama; Hisashi Fujisaki, Tokyo, both of Japan

[73] Assignees: Nippon Telegraph & Telephone Public Corporation; Nippon Electric Co., Ltd., both of Tokyo, Japan

[21] Appl. No.: 328,088

[22] Filed: Dec. 7, 1981

[30] Foreign Application Priority Data

Dec. 9, 1980 [JP] Japan .................................. 55-173470

[51] Int. Cl.³ ............................................ H04M 1/60
[52] U.S. Cl. ................................ 179/81 B; 179/100 L
[58] Field of Search .............. 179/81 B, 100 L, 170.6, 179/170.2; 381/93

[56] References Cited

U.S. PATENT DOCUMENTS

| | | | |
|---|---|---|---|
| 3,952,166 | 4/1976 | Kato et al. | 179/81 B |
| 3,953,676 | 4/1976 | Brown | 179/81 B |
| 4,002,854 | 1/1977 | Penrose | 179/81 B |
| 4,051,325 | 9/1977 | Mafune et al. | 179/81 B |
| 4,052,562 | 10/1977 | Andersen | 179/1 HF |
| 4,053,870 | 10/1977 | Noé | 179/81 B/ |
| 4,057,696 | 11/1977 | Gitlin et al. | 179/170.2 |
| 4,165,445 | 8/1979 | Brosow | 179/1 FS X |
| 4,213,014 | 7/1980 | Luder | 179/170.2 |
| 4,414,432 | 11/1983 | Skerlos et al. | 179/81 B X |
| 4,465,902 | 8/1984 | Zato | 179/81 B X |

Primary Examiner—Keith E. George
Attorney, Agent, or Firm—Blakely, Sokoloff, Taylor & Zafman

[57] ABSTRACT

A loudspeaking telephone system has a voice switch circuit in which voice signals on transmission and reception speech channels are respectively detected to produce control signals, and these control signals are compared to judge the levels of the voice signals on both the speech channels so that the switching between both the channels is effected under the control of loss of variable attenuators inserted in both the speech channels. The control signals corresponding to the voice signals on both the transmission and reception speech channels are converted through analog-to-digital conversion into digital values which are suitable for arithmetic operation. The arithmetic operation is such that the losses of the variable attenuators are automatically controlled in accordance with the use conditions of the loudspeaking telephone system to minimum values which can prevent the howling, transmitting blocking and receiving blocking.

5 Claims, 5 Drawing Figures

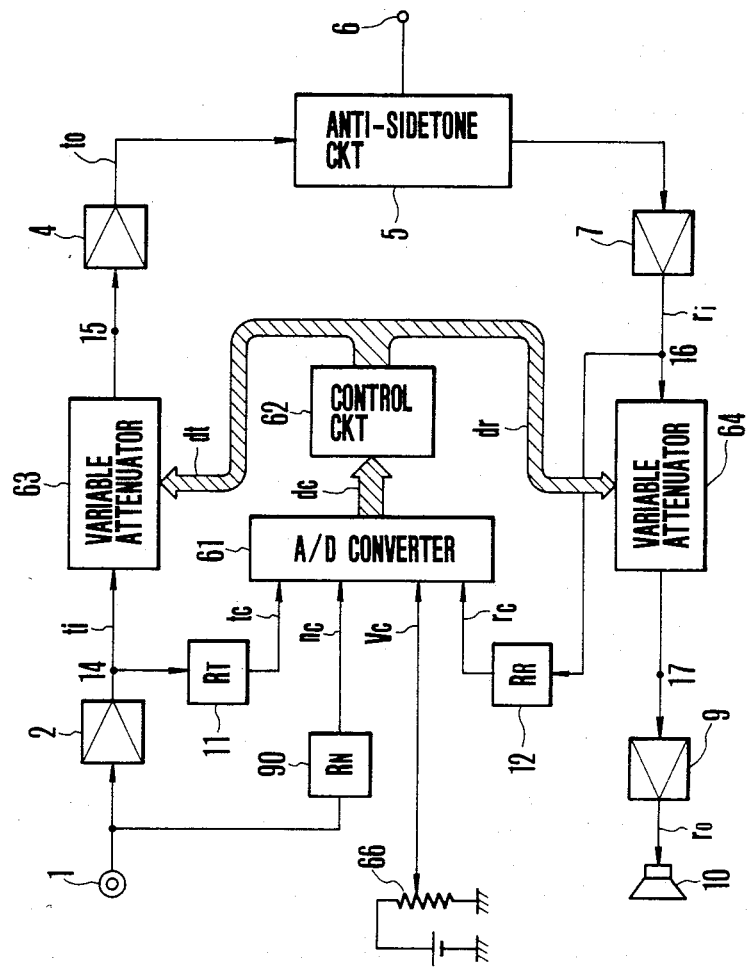
F I G. 5

LOUDSPEAKING TELEPHONE SYSTEM

BACKGROUND OF THE INVENTION

The present invention relates to a loudspeaking telephone system for performing speeches by the use of a speaker and a microphone, and more particularly to a loudspeaking telephone system in which variable attenuations to be inserted into both the transmitting and receiving channels are determined through arithmetic operation by the use of digital signals resulting from analog to digital conversion (hereinafter simply referred to as A/D conversion) and controlled on the basis of results of the arithmetic operation.

As is well recognized in the art, a voice switch circuit (hereinafter, often abbreviated as VS circuit) used in the above loudspeaking telephone system has a function of preventing howling of a loudspeaking telephone circuit. A typical voice switch circuit comprises a comparator for comparing the levels of the voice signals in the transmitting circuit and the receiving circuit, a variable loss circuit for the transmitting circuit responsive to the output from the comparator for inserting a loss in the transmitting circuit and a variable loss circuit for the receiving circuit responsive to the output from the comparator for inserting a loss in the receiving circuit. Where a received signal is present, a portion of the received signal is broadcasted by a loudspeaker and enters into a microphone as a sound signal, but under these conditions the comparator judges that the signal level in the receiving circuit is higher than the signal level in the transmitting circuit whereby a definite loss is inserted in the transmitting line variable loss circuit so as to decrease to zero the loss in the receiving line variable loss circuit. As a consequence, it is possible to hear the received signal at an adequate level without it being attenuated by the receiving line variable loss circuit. At the same time, the transmitting circuit variable loss circuit inserts a loss in the transmitting circuit thereby preventing howling. The condition in which a loss is inserted in the transmitting line as above described is herein termed the "receiving state". On the other hand, when there is no received signal and only the transmitting signal is supplied to the microphone the comparator functions to insert a loss in the receiving circuit variable loss circuit and to reduce to zero the loss in the transmitting circuit variable loss circuit for preventing the howling. The condition in which a loss is inserted in the receiving circuit is herein termed the "transmitting state". Where a speech is transmitted through the microphone under said receiving state, the level of the sum of a portion of the transmitted signal and a portion of the received signal which is supplied to the microphone from the loudspeaker as the round signal becomes higher than the level of a signal applied to the comparator from the receiving circuit with the result that the comparator changes the condition of the loudspeaking telephone circuit to the transmitting state thus enabling offering of a transmitting signal.

In the VS circuit described above, during the receiving state, as the signal level in the receiving circuit which is applied to the comparator is substantially higher than the signal level in the transmitting circuit, even when a speech is offered to the microphone during receiving, it would be extremely difficult to change the VS circuit from the receiving state to the transmitting state. Even when the transmitting state is attained, the initial syllable or the speech burst of the transmitting signal is substantially cut off by the transmitting variable loss circuit thus greatly distorting the speech. Such problems regarding difficulty in the offering and cut off of the initial syllable of the speech burst are also present in a case where the offering of a received signal is made during the transmitting state. In this manner, the prior art voice switch circuit has a serious defect that the initial syllable of the speech burst is lost due to the difficulty in the offering of the transmitted and received signals.

As one approach to these problems, U.S. Pat. No. 3,952,166 discloses a loudspeaking telephone circuit comprising a first rectifier-filter circuit for rectifying and filtering a transmitted signal through a transmittng circuit, a second rectifier-filter circuit for rectifying and filtering a received signal by a receiving circuit, a main comparator for comparing the outputs from the first and second rectifier-filter circuits, a resistance attenuator for attenuating at least one of the outputs from the first and second rectifier-filter circuits, a control comparator for comparing the output from the resistance attenuator with the unattenuated outputs from the first and second rectifier-filter circuits, a memory device for memorizing the output from the control comparator, and transmitting circuit variable loss means and receiving circuit variable loss means which provide an insertion loss to a speech circuit by utilizing the output from the memory device and the main comparator as a parameter.

However, the conventional system of U.S. Pat. No. 3,952,166 still has such a defect as will be described in the following.

First of all, specifically, when the distance between the mike and the speaker is shortened during the speech using the speaker and the mike so that the acoustic coupling condition is deteriorated worse than before, the previous control remains stored in the memory circuit so that the stable receiving state cannot be maintained and what appears to be a malfunction (which will be called the "receiving blocking") takes place and a howling is caused in an extreme case. Secondly, when the side tone coupling condition in the course of connecting the circuit system with the remote subscriber is deteriorated, the voice switching circuit cannot maintain the stable "transmission state" similarly to the aforementioned first defect and what appears to be a malfunction (which will be called the "transmission blocking") takes place and a howling is caused in an extreme case. Thirdly, by the influences of the dispersion in the variable resistance characteristics belonging to the field effect transistors of each variable loss circuit, there are caused in the course of the switching between the "transmitting state" and the "receiving state" of the voice switching circuit a howling and the voice is cut more than necessary. Fourthly, the changing characteristics of the variable loss circuit during the switching between the "transmitting state" and the "receiving state" of the voice switching circuit depend upon the variable resistance characteristics belonging to the field effect transistors thereby to make it difficult to realize desired characteristics. Fifthly, the number of the parts of the circuit is increased, and memory capacitors are required to invite a disadvantage in size reduction and in economy.

SUMMARY OF THE INVENTION

A major object of the present invention is to provide a loudspeaking telephone system capable of automatically controlling the losses of variable attenuators of a voice switch circuit with digital control signals corresponding to the voice signals in accordance with use conditions of the loudspeaking telephone system.

Another object of the invention is to provide a loudspeaking telephone system capable of reflecting the volume quantity in the automatic controlling of the losses of the variable attenuators.

Another object of the invention is to provide a loudspeaking telephone system capable of reflecting the ambient noise in the automatic controlling of the losses of the variable attenuators.

Still another object of the invention is to provide a compact and economical voice switch circuit.

Broadly, according to the invention in a loudspeaking telephone system of the type in which voice signals on transmission and reception speech channels are respectively detected to produce control signals, and these control signals are compared to judge the levels of the voice signals on both the speech channels so that the switching between both the channels is effected under the control of loss of variable attenuators inserted in both the speech channels, the system comprises: means for converting the control signals corresponding to the voice signals on both the transmission and reception speech channels through analog-to-digital conversion into digital values; means for effecting arithmetic operation on first and second digital signals having said digital values and comparison between results of the arithmetic operation; and the variable attenuators being controllable by digital signals based on results of the comparison.

BRIEF DESCRIPTION OF THE DRAWINGS

FIG. 5 is a block diagram showing another embodiment of the present invention.

DESCRIPTION OF PREFERRED EMBODIMENTS

Figure 1:
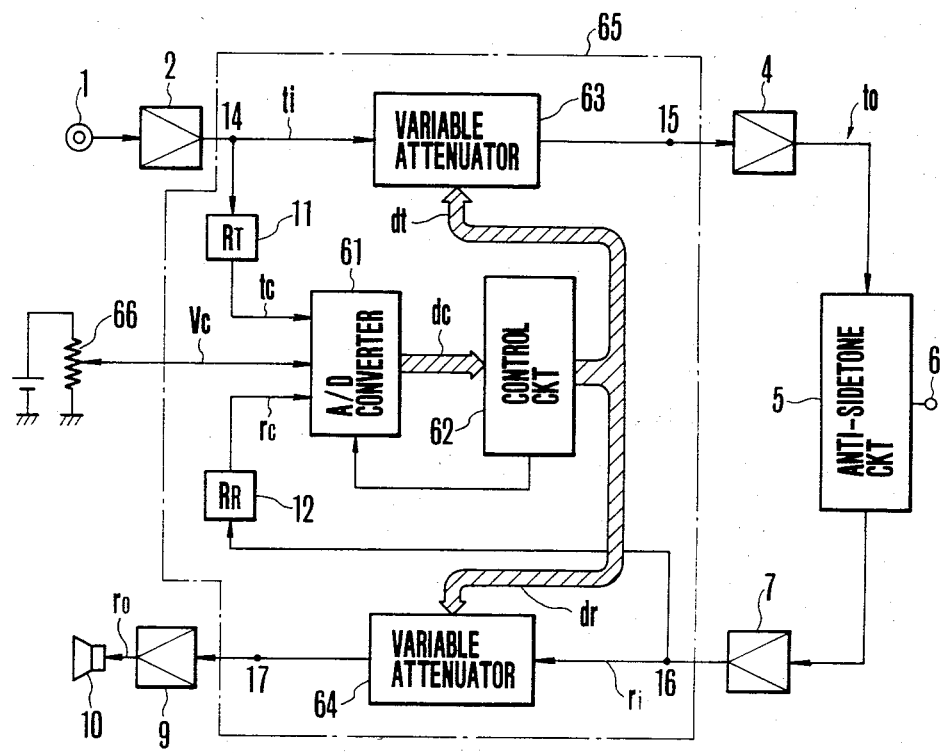
FIG. 1 is a block diagram showing one embodiment of a loudspeaking system according to the present invention.

Referring now to FIG. 1, there is shown a preferred embodiment of a loudspeaking telephone system according to the invention. The loudspeaking telephone system comprises a microphone (which will be shortly referred to as a "mike") 1, transmission amplifiers 2 and 4, an anti-sidetone circuit 5, reception amplifiers 7 and 9, and a speaker 10. A voice switch circuit 65 adapted to prevent the howling which is caused by the acoustic coupling of the speaker 10 and the mike 1 comprises a rectifying-smoothing circuit 11 ($R_T$) connected to an input terminal 14 and a rectifying-smoothing circuit 12 ($R_R$) connected to an input terminal 16. The transmission amplifier 2 is connected to the input terminal 14 and the transmission amplifier 4 is connected to an output terminal 15. Similarly, the reception amplifier 7 is connected to the input terminal 16 and the reception amplifier 9 is connected to an output terminal 17. Denoted by 6 is a line terminal connected to the anti-sidetone circuit 5. The voice switch 65 further comprises an A/D converter 61, a control circuit 62 which is made receptive of the output of the A/D converter 61 at its input, variable attenuators 63 and 64 which are to be controlled by the output of the control circuit 62. Denoted by 66 is a variable resistor for adjusting the reception volume.

Moreover, letters $d_t$ and $d_r$ indicate digital control signals and their signal lines for controlling the variable attenuator 63 and the variable attenuator 64, respectively. Letter $d_c$ indicate the output digital signal and signal line of the A/D converter 61. Letter $v_c$ indicates a reception volume adjusting signal and its signal line. Letter $t_i$ indicates a transmission input signal, i.e., the ouptput signal of the transmission amplifier 2. Letter $t_o$ indicates a transmission output signal, i.e., the output signal of the transmission amplifier 4. Letter $r_i$ indicates the reception input signal, i.e., the output signal of the reception amplifier 7. Letter $r_o$ indicates a reception output signal, i.e., the output signal of the reception amplifier 9. Letters $t_c$ and $r_c$ indicate a transmission level signal and a reception level signal, respectively, i.e., the output signals of the rectifying-smoothing circuit 11 ($R_T$) and the rectifying-smoothing circuit 12 ($R_R$).

The operation of this embodiment shown in FIG. 1 will now be described. First of all, the output signal from the mike 1 is fed through the transmission amplifier 2. The transmission input signal $t_i$ of the transmission amplifier 2 is fed as the transmission output signal $t_o$ through the variable attenuator 63, which is controlled by the digital control signal $d_t$, and through the transmission amplifier 4 to the anti-sidetone circuit 5 until it is fed out of the line terminal 6.

On the other hand, a reception signal received by the line terminal 6 is fed to the anti-sidetone circuit 5 and the reception amplifier 7 to generate the reception input signal $r_i$. This reception input signal $r_i$ is fed through the variable attenuator 64, which is controlled by the digital control signal $d_r$, and through the reception amplifier 9 until it is fed as the reception output signal $r_o$ to the speaker 10.

Moreover, the transmission input signal $t_i$ and the reception input signal $r_i$ are converted by the rectifying-smoothing circuits 11 ($T_T$) and 12 ($R_R$), respectively, into the transmission level signal $t_c$ and the reception level signal $r_c$. Here, although the A/D converter 61 can be used exclusively for the transmission level signal $t_c$ and the reception level signal $r_c$, respectively, it can also be used commonly in a time division manner, as is exemplified in the embodiment of FIG. 1. Moreover, the adjustment of the reception volume can be performed by converting the volume adjusting signal $v_c$, which is generated by the volume adjusting variable resistor 66, into the digital signal $d_c$ by the use of the same A/D converter 61. And, the transmission level signal $t_c$, reception level signal $r_c$ and reception volume adjusting signal $v_c$, which are fed to that A/D converter 61, are respectively converted into the digital signals $d_c$, which are fed to the control circuit 62.

Here, in order to determine both the acoustic coupling rate (at which a round signal portion of the reception signal emanating from the speaker 10 interacts to crosstalk into the mike 1) and the sidetone coupling rate (at which a round signal portion of the transmission signal interacts to crosstalk through the anti-sidetone circuit 5 to the reception amplifier 7) from the transmission level signal $t_c$ and the reception level signal $r_c$, multiplication and division operations are required if both the rectifying-smoothing circuits and the A/D converter have linearities. Therefore, if the digital value is converted into a logarithm of its anti-logarithm to produce a value proportional to the digital indication, the arithmetic operation can be accomplished by addition and subtraction having fast operation rates in place of the multiplication and division. Here, in this embodiment shown in FIG. 1, the rectifying-smoothing circuits are realized with linear characteristics having the most proper time constant having already been attained, and the logarithmic conversion is performed by the A/D converter 61 per se to make unnecessary the arithmetic means for converting the aformentioned anti-logarithm to a logarithm and to perform the arithmetic operation at the control circuit 62 through the addition and subtraction.

Moreover, that control circuit 62 receives a transmission input level $T_i$ [dB] (i.e., a digital signal which is logarithmically indicated to correspond to the transmission level signal $t_c$) and a reception input level $R_i$ [dB] (i.e., a digital signal which is logarithmically indicated to correspond to the reception level signal $r_c$) from the digital signal $d_c$, which has been subjected to the A/D conversion, so that it performs such arithmetic operations as will be detailed later to determine an insertion loss $L_T$ [dB] of the transmission channel and an insertion loss $L_R$ [dB] of the reception channel thereby to control the variable attenuator 63 of the transmission channel and the variable attenuator 64 of the reception channel with the digital control signal $d_t$ and the digital control signal $d_r$, respectively.

Here, if a circuit, e.g., the so-called "microcomputer system" is used as the control circuit 62, the arithmetic operation, the controlling of the variable attenuators 63 and 64, and further the controlling of the A/D converter 61 can be all performed by the program control and can be coped with even for a variety of circuit conditions such as general telephone circuits or automotive telephone circuits and for a variety of acoustic conditions with the use of a similar circuit construction but by changing the programs. A loudspeaking telephone system, which is made small and economical, can be realized especially by using a circuit which is called a one-chip microcomputer.

Incidentaly, the loudspeaking telephone system according to the present invention adopts the type, in which the A/D conversions are effected after the rectifying-smoothing operations.

This is because: (1) the peak factor (about 12 dB) of an a.c. voice signal is formed into an envelope waveform averaged by the rectifying-smoothing circuits so that the number of quantized bits can be reduced; (2) since the charging and discharging time constants of the present rectifying-smoothing circuits are sufficiently lower than the minimum frequency of a telephone transmission band, the A/D converting rate can be lowered; and (3) the rectifying-smoothing circuits can be easily made to have frequency characteristics for separating voice signals and noises. Especially because of the aformentioned items (1) and (2), the selecting range of the arithmetic control circuit 62 to be used can be widened to contribute to economy.

Next, the arithmetic operation for determining the insertion loss $L_T$ [dB] of the transmission channel and the insertion loss $L_R$ [dB] of the reception channel will be detailed in the following.

First of all, when only the transmission voice signal is impressed upon the mike 1 so that the loudspeaking telephone circuit is at the "transmitting state", the level $TA_{in}$ [dB], by which the transmission input signal $T_i$ [dB] exceeds a threshold level $TA_{th}$ of a transmission automatic gain control (which will be shortly referred to as "T-AGC") is calculated. The threshold level $TA_{th}$ herein represents a predetermined value at which the output begins to become unchanged for the inputs exceeding a predetermined value when T-AGC comes into force in linear input/output characteristics. Specifically, the level $TA_{in}$ [dB] is expressed as a function of a discrete time n for sampling by the following equation:

$$TA_{in}(n+1) = T_i(n+1) - TA_{th} \quad (1)$$

Next, the result of the equation (1) is compared with the previous T-AGC control $TA_{out}(n)$, which is a controlled value obtained one control interval before. If the following relationship holds, the control $TA_{out}$ is increased:

$$TA_{in}(n+1) \geq TA_{out}(n) \quad (2);$$

and if the following relationship holds, the control $TA_{out}$ is decreased:

$$TA_{in}(n+1) < TA_{out}(n) \quad (3).$$

Moreover, if a constant $C_1$ is added to increase the control $TA_{out}$, the T-AGC control is linearly increased (in view of decibels) with time. This is expressed by the following equation:

$$TA_{out}(n+1) = TA_{out}(n) + C_1 \quad (4).$$

On the other hand, in order to decrease the control $TA_{out}$ when the aforementioned equation (3) holds, the T-AGC control is linearly decreased (in decibels) with time if a constant $C_{2\ L\ is\ subtracted}$. This is expressed by the following equation:

$$TA_{out}(n+1) = TA_{out}(n) - C_2 \quad (5).$$

Here, if the T-AGC control $TA_{out}$ is limited to be positive or zero, it is not compressed by the T-AGC control if the transmission input signal level $T_i$ [dB] is not more than the T-AGC threshold level $TA_{th}$ at a steady state. On the contrary, if the input signal level $T_i$ [dB] is not less than the T-AGC threshold level $TA_{th}$, the control $TA_{out}$ becomes equal to the level $TA_{in}$ expressed by the foregoing equation (1) so that it is accordingly compressed by the transmission automatic gain control T-AGC.

As a result, in case that transmission voice signal is higher at the "transmitting state" that the preset T-AGC threshold level $TA_{th}$, the insertion loss of the transmission channel $L_T$ is expressed by the following equation:

$$L_T = TA_{out} \quad (6).$$

Likewise, when only the reception voice signal is impressed upon the line terminal 6 so that the loudspeaking telephone circuit is at the "receiving state", an R-AGC control $RA_{out}$ is calculated from both the reception input signal level $R_i$ and a threshold level $RA_{th}$

[dB] of a reception automatic gain control shortly referred to as "R-AGC" herein.

And, the loss $L_R$ to be inserted into the reception channel at the "receiving state" is constructed of a volume rise VOL [dB], which is determined from the volume adjusting signal $v_c$, in addition to the aforementioned R-AGC control $RA_{out}$.

If the reception volume is set such that it becomes the maximum when that volume rise VOL is expressed by the following equation:

$$VOL = VOL_{max} \quad (7),$$

and such that it becomes the minimum when that volume rise VOL is expressed by the following equation:
$$VOL = 0 \quad (8),$$

the insertion loss $L_R$ of the reception channel at the "receiving state" is expressed by the following equation:

$$L_R = VOL_{max} - VOL + RA_{out} \quad (9).$$

Incidentally, the aforementioned losses $L_T$ and $L_R$ at the "transmitting state" and at the "receiving state", respectively, reduce the insertion losses $L_R$ and $L_T$ of the reception and transmission channels at the "transmitting state" and at the "receiving state", respectively, in reciprocal manners.

Next, the following description is directed to a control $\alpha_{out}$ [dB], which is used, depending on the acoustic coupling rate determined at the "receiving state", to reduce the insertion loss $L_T$ of the transmission channel thereby to change the judging level for switching the transmission and reception.

Similar to the description in connection with the T-AGC circuit, the control $\alpha_{out}(n+1)$ due to the acoustic coupling changes in accordance with the difference between $\alpha_{out}(n)$ and $\alpha_{in}(n+1)$ and linearly with time.

First of all, the control $\alpha_{in}$ is determined from the reception output signal level $[R_i - L_R]$ and the transmission input signal level $T_i$. Specifically, $$\alpha_{in} = [R_i - L_R] - T_i - l\alpha \quad (10),$$

stands where $l\alpha$ designates a constant for reserving the receiving blocking tolerance which is determined by the level diagram of the loudspeaking telephone circuit.

Likewise, a control $\beta_{out}(n+1)$ [dB], which is used, depending on the sidetone coupling rate determined at the "receiving state", to reduce the insertion loss $L_R$ of the reception channel thereby to change the judging level for switching the transmission and reception, changes in accordance with the difference between $\beta_{out}(n)$ and $\beta_{in}(n+1)$ and linearly with time. Specifically, $\beta_{in}$ is expressed as:

$$\beta_{in} = [T_i - L_T] - R_i - l\beta \quad (11),$$

where $l\beta$ designates a constant for reserving the transmitting blocking tolerance which is determined by the level diagram of the loudspeaking telephone circuit.

When a subtraction constant $C_3(R_i(n+1), \alpha_{out}(n) - \alpha_{in}(n+1))$ which is a function of the reception input signal level $R_i(n+1)$ and $\alpha_{out}(n) - \alpha_{in}(n+1)$ is used for the condition $\alpha_{out}(n) < \alpha_{in}(n+1)$, and a subtraction constant $C_4(T_i(n+1), \beta_{out}(n) - \beta_{in}(n+1))$ which is a function of the transmission input signal level $T_i(n+1)$ and $\beta_{out}(n) - \beta_{in}(n+1)$ is used for the condition $\beta_{out}(n) < \beta_{in}(n+1)$, $$\alpha_{out}(n+1) = \alpha_{out}(n) - C_3$$

$$\beta_{out}(n+1) = \beta_{out}(n) - C_4$$

are held. Then, it is possible to realize the quick and slow time constant characteristics which correspond to the change in the acoustic coupling rate or the sidetone coupling rate in accordance with the changes in the positions of the mike and the speaker 10 and to depress in advance or within a short time the receiving blocking malfunction or the transmitting blocking malfunction which is caused by the change in each coupling rate.

As is apparent from the description thus far made, the variable loss $L_T$ to be inserted into the transmission channel at the "receiving channel" is expressed by the following equation:

$$L_T = L_o + VOL - RA_{out} - \alpha_{out} - \beta_{out} \quad (12),$$

and the variable loss $L_R$ to be inserted into the reception channel at the "transmitting state" is expressed by the following equation:

$$L_R = L_o + VOL_{max} - TA_{out} - \alpha_{out} - \beta_{out} \quad (13).$$

Here, $L_o$ designates the loss to be inserted at the minimum reception volume.

And, the judgement of switching the "receiving state" to the "transmitting state" is performed in the following manner. The transmission input signal level $T_i$ is compared with the transmission threshold level $T_{th}$. If the following relationship holds:

$$T_i \geq T_{th} \quad (14),$$

the transmission input signal $T_i$ is further compared with the reception input signal level $R_i$. If the following equation holds, the "receiving state" is switched to the "transmitting state":

$$T_i + \alpha_{out} > R_i - L_R + l_R \quad (15).$$

Here, $l_R$ designates a constant which is determined by the level diagram of the loudspeaking telephone circuit.

On the other hand, the judgement of switching the "transmitting state" to the "receiving state" is performed in the following manner. If the aforementioned equation (14) fails to hold, the state is gradually switched to the "receiving state" (which is generally called the "hangover"). However, if the equation (14) and the following equation $$R_i + \beta_{out} > T_i - L_T + l_T$$

holds, the state is quickly changed to the "receiving state". Here, $l_T$ designates a constant which is determined by the level diagram of the loudspeaking telephone circuit.

Since the control circuit 62 executes the controls thus far described, while monitoring the transmission and reception input level at all times, so that it grasps all the operations of one control, it is determined by the arithmetic operation that the loudspeaking telephone circuit has reached the so-called "negative hysterisis" (i.e., the unstable operating region in which the transmitting and receiving states are alternatively repeated). At this time, the switching between the transmission and reception is promptly stopped, and the losses of the variable attenuators 63 and 64 to be inserted into the transmission channel and the reception channel are set at the minimum loss which is based upon the losses by the T-AGC and R-AGC.

Figure 2:
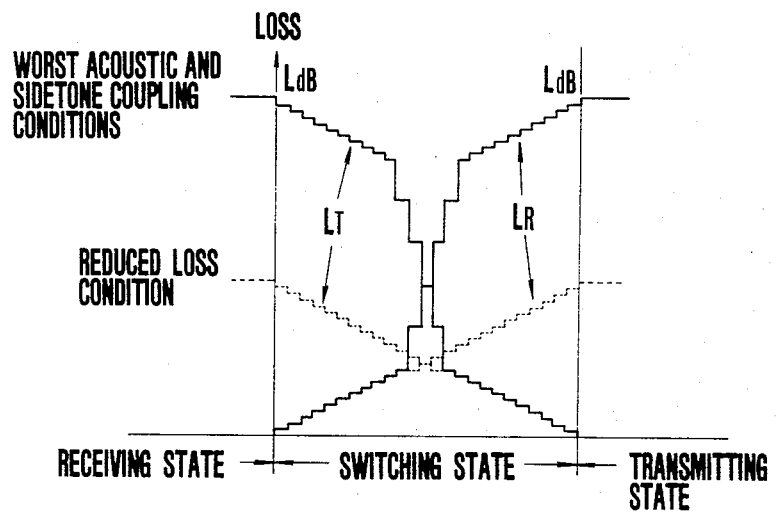
FIG. 2 is an explanatory view illustrating the loss changing characteristics of the variable attenuator to be used in the present invention.

FIG. 2 is an explanatory diagram illustrating the changing characteristics of losses of the variable attenuators 63 and 64 in accordance with the state of the loudspeaking telephone system according to the present invention. In FIG. 2: solid lines correspond to the case immediately after the initial setting or in which both the acoustic coupling rate and the side tone coupling rate are the worst, i.e., in which the reduction of the losses to be inserted are zero; and dotted lines correspond to the case in which losses are reduced at certain acoustic and sidetone coupling rates.

And, since the reciprocal operation can be effected arbitrarily and accurately by the arithmetic operation controlling at the control circuit 61 the changes in the losses of the variable attenuators 63 and 64 at the switching rate can be such that the changes for a predetermined time period immediately after the start and before the end of switching the losses are so reduced that the initial syllable loss at the switching of the losses can be lightened whereas the intermediate changes are increased, so that the overall switching time period can be set at a short level.

Figure 3:
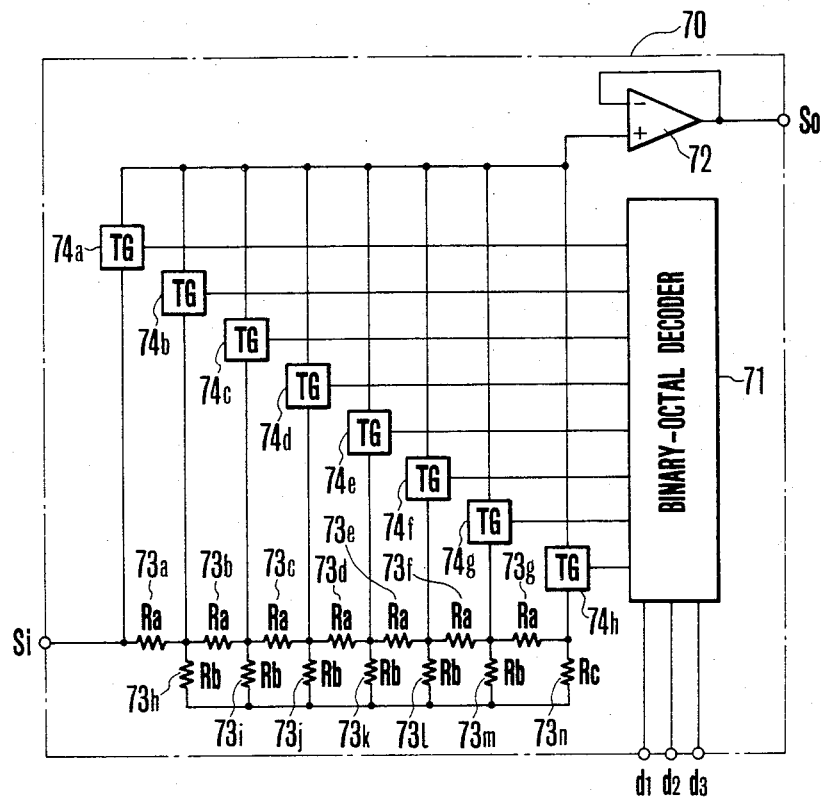
FIG. 3 is a circuit diagram showing an example of the construction of the variable attenuator shown in FIG. 1.

Next, an example of the construction of the variable attenuator 63 or 64 of each speech channel will be described with reference to FIG. 3. In FIG. 3, reference numeral 70 indicates the variable attenuator, which corresponds to the variable attenuator 63 or 64 shown in FIG. 4 and which comprises a binary-octal decoder 71, a buffer amplifier 72, fixed resistors 73a to 73g ($R_a$), 73h to 73m ($R_b$) and 73n ($R_c$), and analog switches 74a to 74h (TG). Characters $d_1$, $d_2$ and $d_3$ indicate digital control signals, and $S_i$ and $S_o$ the input and output signals of the variable attenuator 70.

Next, the operation of the attenuator shown in FIG. 3 will be described. First of all, the input signal $S_i$ to the variable attenuator 70 is applied to the ladder-type network which is composed of the fixed resistors 73a to 73g ($R_a$), 73h to 73m ($R_b$) and 73n ($R_c$), and one of the analog switches 74a (TG) to 74h (TG) connected with the respective nodes of that ladder-type network is rendered conductive by the digital signals which are decoded from the digital control signals $d_1$, $d_2$ and $d_3$ by the binary-octal decoder 71. Moreover, the voltage at the node, with which the analog switch circuit (TG) thus rendered conductive is connected, is fed out as the output signal $S_o$ by way of the buffer amplifier 72 having a high input impedance.

Here, if the fixed resistors have such resistances as expressed below:

73a to 73g ($R_a$) = 1.088 k$\Omega$;
73h to 73m ($R_b$) = 81.95 K$\Omega$; and
73n ($R_c$) = 8.912 K$\Omega$, then the variable attenuator 70 shown in FIG. 3 has its loss changed at a step of 1 dB from 0 dB to 7 dB.

On the other hand, if the fixed resistors have such resistances as are expressed below:

73a to 73g ($R_a$) = 6.019 K$\Omega$;
73h to 73m ($R_b$) = 6.615 K$\Omega$; and
73n ($R_c$) = 3.981 K$\Omega$, then the variable attenuator 70 shown in FIG. 3 has its loss changed at a step of 8 dB from 0 dB to 56 dB. In the afore-specified resistances, the ratio between these resistances plays an important role, but absolute values have a degree of freedom.

By connecting the attenuator of the step of 1 dB and the attenuator of the step of 8 dB in series, moreover, it is possible to construct the variable attenuator which is changed at the step of 1 dB to 63 dB in response to the digital control signals of 6 bits.

The losses can be set remarkably accurately by the digital control signals if the variable attenuator 70 thus constructed is used.

Moreover, if the signal, which is prepared by adding a d.c. signal to the inphut signal $S_i$ of that variable attenuator 70, is used in the digital/analog converter (i.e., the D/A converter), it is possible to construct the A/D converter which can produce a digital signal having a value indicated in decibels of the input signal level.

Figure 4:
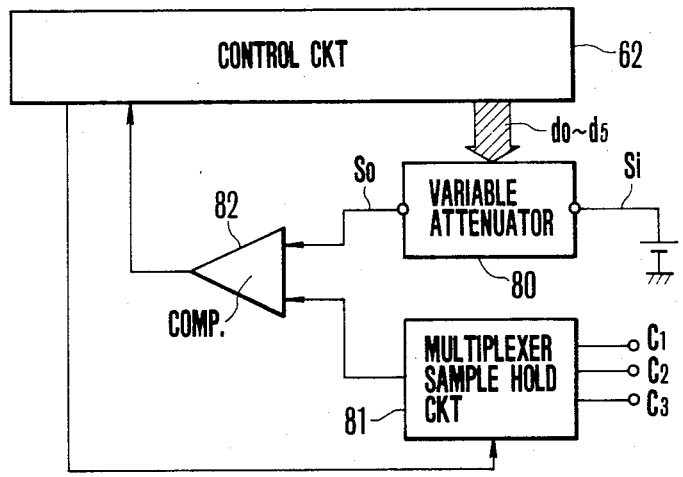
FIG. 4 is a circuit diagram showing an example of the construction of the A/D converter shown in FIG. 1.

FIG. 4 is a circuit diagram showing an example of the A/D converter 61 shown in FIG. 1. In FIG. 4, reference 62 indicates a control circuit, 80 a variable attenuator which is made receptive of the d.c. signal $S_i$ for feeding out the d.c. output signal $S_o$, 81 a multiplexer sample hold circuit which is made receptive of analog input signals $c_1$, $c_2$ and $c_3$ and which is to be controlled by the control signals from the control circuit 62, and 82 a comparator for comparing the output of the variable attenuator 80 and the output of the multiplexer sample hold circuit 81.

Next, the operation of the embodiment of the A/D converter shown in FIG. 4 will be described.

The output of the multiplexer sample hold circuit 81, which is made operative to select the analog input signals $c_1$, $c_2$ and $c_3$ and to effect the sample holding operation, and the output signal $S_o$ of the variable attenuator 80, which has received the d.c. signal $S_i$, are fed to the comparator 82, in which they are compared. The output of the comparator 82 is fed to the control circuit 62 to control the variable attenuator 80 with the digital signals $d_0$ to $d_5$ of six bits. Thus, a sequential comparation type A/D converter can be constructed.

FIG. 5 is a block diagram showing another embodiment of the present invention. In FIG. 5, the same reference characters as those of FIG. 1 indicate the corresponding parts. Reference numeral 90 ($R_N$) indicates a noise detecting filter-rectifier circuit, and letter $n_c$ indicates the output signal of the filter-rectifier circuit 90, i.e., the noise level signal.

Here, the difference of the embodiment shown in FIG. 5 from the embodiment shown in FIG. 1 resides in that the loudspeaking telephone circuit of the embodiment shown in FIG. 1 is modified to incorporate the filter-rectifier smoothing circuit 90 ($R_N$) for detecting the ambient noise received by the mike 1 so that the ambient noise is fed as the noise level signal $n_c$ to the A/D converter 61, in which it is converted into the digital signal $d_c$ which in turn is fed to the control circuit 62.

In the control circuit 62, moreover, a noise N [dB] is determined by the digital signal $d_c$ having been subjected to the A/D conversion to raise the transmission threshold level $T_{th}$ in accordance with the noise level N so that the receiving blocking malfunction and the deterioration in the reception interrupting characteristics both due to the noise can be prevented.

Moreover, the volume VOL is raised in accordance with the noise level N so that the deterioration of the S/N ratio of the reception signals due to the noise can be prevented.

Thus, the present invention is constructed such that the ambient noise is detected by the transmission input signal and is converted through the A/D conversion into the digital value so that the ambient noise level is calculated through the arithmetic operation, and such that the threshold level of the transmission channel is so controlled through the arithmetic operation as to rise in accordance with the ambient noise level so that the malfunction due to the ambient noise may be prevented. Moreover, the present system is further constructed such that the ambient noise is detected by the transmission input signal and is converted through the A/C conversion into the digital value so that the ambient noise level is calculated through the arithmetic operation, and such that the reception volume is so determined through the arithmetic operation as to rise in accordance with the ambient noise level so that the variable loss may be controlled in accordance with that arithmetic result.

The present invention can attain the following many effective advantages over the system of this kind according to the prior art by using the circuit construction and arithmetic method thus detailed hereinbefore.

First of all, specifically, all the loss control by the transmission automatic gain control and the reception automatic gain control, the loss control according to the acoustic coupling rate depending upon the positions of the mike and the speaker and to the side tone coupling rate at the two-to-four wire converter, and the loss control upon the reception volume adjustment are effected together to the minimum insertion loss under the using condition so that the stable loudspeaking telephone system, which is excellent in the simultaneous speaking and interrupting characteristics and which can prevent a negative hysteresis region from being formed, can be realized. Secondly, the blocking malfunction can be promptly stopped by making the reducing operation of the insertion loss automatically follow the changes in the using condition. Thirdly, the quick and slow operations of the aforementioned automatic follow control and the switching control of the insertion loss can be executed by the program control so that the dynamic characteristics having little initial syllable loss and clicking can be realized. Fourthly, the various kinds of static and dynamic controls thus far described and the threshold and reception volume controls according to the noise level at ambient place, where the loudspeaking telephone is disposed, can be realized with the circuit construction which is easier and simpler than the system of the prior art.

Thus, according to the present invention, there can be attained such more effects than those of the system of this kind according to the prior art as are unique as the loudspeaking telephone system.

What is claimed is:

1. In a loudspeaking telephone system of the type in which voice signals on transmission and reception speech channels are respectively detected to produce control signals, and these control signals are compared to judge the levels of the voice signals on both the speech channels so that the switching between both the channels is effected under the control of loss of digitally controlled attenuators inserted in both the speech channels, the improvement wherein said system comprises:

means for converting the control signals corresponding to the voice signals on both the transmission and reception speech channels through analog-to-digital conversion into digital signals; and means, with the use of a microprocessor as a calculating unit, for comparing the magnitudes of transmission and reception signals by arithmetic operation on the digital signals attained through said conversion, and effecting a control of the switching of the loss of said digitally controlled attenuators based on the result of said comparison.

2. A loudspeaking telephone system as set forth in claim 1, wherein the minimum insertion loss freed from establishing howling transmission and reception blockings is determined through the comparison operation by said microprocessor so that the variable loss to be inserted into said speech channel is set at and controlled to the minimum value on the basis of the results of the comparison operation.

3. A loudspeaking telephone system as set forth in claim 1 further comprising volume adjusting means for generating a volume adjusting signal in the form of a DC voltage, said volume adjusting signal being converted through the analog-to-digital conversion into a digital value which in turn is subjected to the comparison operation to determine a volume adjusting quantity, the reception volume being controlled on the basis of results of the comparison operation.

4. A loudspeaking telephone system as set forth in claim 1 further comprising means for detecting the ambient noise from a transmission input signal, a signal representative of the ambient noise being converted through the analog-to-digital conversion into a ditital value which in turn is subjected to the comparison operation to determine an ambient noise level, the threshold level of said transmission speech channel being so controlled through the comparison operation that it rises in accordance with the ambient noise level so that a malfunction due to the ambient noise can be prevented.

5. A loudspeaking telephone system as set forth in claim 1 further comprising means for detecting the ambient noise from a transmission input signal, a signal representative of the ambient noise being converted through the analog-to-digital conversion into a digital value which in turn is subjected to the comparison operation to determine an ambient noise level, the reception volume being so determined through the comparison operation that it rises in accordance with the ambient noise level so that said digitally controlled attenuators may be controlled on the basis of results of the comparison operation.

* * * * *

UNITED STATES PATENT AND TRADEMARK OFFICE
CERTIFICATE OF CORRECTION

PATENT NO. : 4,513,177
DATED : 4/23/85
INVENTOR(S) : Nishino et al.

It is certified that error appears in the above-identified patent and that said Letters Patent is hereby corrected as shown below:

| COLUMN | LINE | DESCRIPTION |
|--------|------|-------------|
| 6 | 6 | Insert --level-- between "signal" and "$T_i$" |
| 9 | 22 | Delete "rate" insert --state-- |

Signed and Sealed this

Ninth Day of August, 1988

Attest:

DONALD J. QUIGG

Attesting Officer     Commissioner of Patents and Trademarks